United States Patent [19]

Rodgers

[11] 4,398,158
[45] Aug. 9, 1983

[54] DYNAMIC RANGE EXPANDER

[75] Inventor: Robert L. Rodgers, Arlington, Tex.

[73] Assignee: Micmix Audio Products, Inc., Dallas, Tex.

[21] Appl. No.: 209,695

[22] Filed: Nov. 24, 1980

[51] Int. Cl.$^3$ .............................................. H03G 7/00
[52] U.S. Cl. .................................... 330/136; 330/138; 330/279; 333/14
[58] Field of Search ............... 330/136, 138, 141, 279, 330/280, 281; 333/14

[56] References Cited

U.S. PATENT DOCUMENTS

| 2,948,860 | 8/1960 | Affelder | 333/14 X |
| 3,681,618 | 8/1972 | Blackmer | 328/145 X |
| 3,789,143 | 1/1974 | Blackmer | 179/15.55 R |

FOREIGN PATENT DOCUMENTS 35592 3/1960 Japan ..................................... 333/14

OTHER PUBLICATIONS

"Signetics Compandor Mini-Manual", NE570/571 Monolithic Dual Compressor/Expandor, pp. 3-16.

"DBX Model 3 BX 3 Band Dynamic Range Extender Instruction Manual".

Primary Examiner—James B. Mullins
Attorney, Agent, or Firm—Kanz & Timmons

[57] ABSTRACT

A dynamic range expander which substantially limits the amount of positive expansion without affecting the amount of negative expansion is disclosed. In one arrangement, gain reduction in the amplitude of the output signal is increased when the amplitude of the input signal decreases toward or becomes less than the noise level present in the input signal. The dynamic range expander includes a detector (24) for sensing the amplitude of the input signal and providing a variable DC signal related to the amplitude of the input signal, a control signal generator (30) and an amplifier (34) for amplifying the input signal by a gain variable responsively to the output of the control signal generator. The control signal generator includes a time averager (50) and a summer (40) for providing a second variable DC signal related to the sum of the detector output and the time averaged detector output. The control signal generator further includes a precision clamp (56) for clamping the control signal, thereby limiting the amount of positive expansion of the input signal.

6 Claims, 2 Drawing Figures

DYNAMIC RANGE EXPANDER

DESCRIPTION

1. Technical Field

The present invention relates to signal conditioning and in one of its aspects to signal compression and expansion.

Much of the excitement of a live musical performance is missing in a recorded or broadcast performance. The loss of excitement is primarily due to the restricted dynamic range of the recorded or broadcast performance. The loudest sounds in a live performance may reach 120 decibels (dB) sound pressure level (SPL). Ambient room noise in a very quiet auditorium is somewhat over 30 dB SPL. The usable dynamic range of such a live performance is derived by subtracting the room noise from the tolerable extremely loud sounds, giving a maximum of about 90 dB. Recording studios have less room noise and a dynamic range of over 100 dB can be achieved.

The dynamic range of a recorded program is, however, purposely restricted in order to fit within the dynamic range limitations of recording or broadcast media, such as records or tapes. Typically, the dynamic range of a studio quality tape recorder is about 60 dB whereas home tape recorders are typically around 45 dB. A very good phonograph disc will have a maximum dynamic range of only about 65 dB. The dynamic range of an FM radio broadcast is only about 60 dB.

In order to avoid serious distortion of a performance, compression is used in the recording or broadcast. A compressor increases the level of quiet passages and decreases the level of loud passages.

2. Background Art

An expander acts to reverse the effects of a compressor, decreasing the level of quiet musical passages and increasing the level of loud musical passages. A typical expander increases the level of the signal when the signal is above a predetermined threshold level and decreases the level of the signal when the signal is below the threshold level. A detection circuit is used to sense the input signal level. Different expanders use different methods for detecting the input signal level. Peak detection and average detection are common, and RMS detection is shown in U.S. Pat. No. 3,789,143 of Blackmer.

Expanders typically include means to vary the expansion ratio which is the ratio of the output signal dynamic range to the dynamic range of the input signal. This is normally expressed as 1:X where X is equal to or greater than 1. For example, if the expansion ratio is 1:2, a 1 dB change in the amplitude level at the input will result in a 2 dB change in the amplitude level of the output signal. This is referred to as positive expansion. If there is no change in amplitude level of the input signal, the amplitude level of the output signal will remain constant and typically will be at the same amplitude level as the input signal.

Negative expansion is the reverse of positive expansion, using gain reduction. During the application of gain reduction, the noise floor, which is usually below the amplitude of the smallest program signal level present by some predetermined value, is also expanded downwardly, therefore apparently reduced. This reduction in noise amplitude is, however, due to the presence of a changing program signal amplitude level. In the absence of an input signal, whether momentary or continuous, or during extremely low level passages of relatively constant amplitude, no downward expansion occurs and typically the noise amplitude present at the input will appear at the output.

Some available expanders provide a settable threshold level above which positive expansion occurs and below which negative expansion occurs. As the type or content of program material varies, significant amplitude level changes may occur in the output signal when the amount of expansion is varied, due to the need to reset the threshold level. This is a significant deficiency in those applications where it is desired to vary the expansion ratio in the presence of program material when the program material may vary significantly in type or content.

DISCLOSURE OF INVENTION

A dynamic range expander in accordance with the present invention includes means for sensing the amplitude of an input signal and for providing a variable DC signal related to the amplitude of the input signal, means for providing a control signal related to the variable DC signal and means for amplifying the input signal by a gain variable responsively to the control signal. The control signal substantially limits the amount of positive expansion of the input signal. In a preferred arrangement, the means for providing a control signal clamps the control signal, the clamping of the control signal substantially limiting the amount of positive expansion of the input signal at the output of the dynamic range expander. In one arrangement, the means for providing a control signal includes both means for providing a second variable DC signal related to the variable DC signal and means for clamping the second variable DC signal. The control signal is related to the clamped second variable DC signal.

A preferred means for providing a second variable DC signal provides increasing the amount of gain reduction in the dynamic range expander when the input signal decreases toward the expected noise level. A preferred means for providing a second variable DC signal includes a first branch with a variable DC input related to the variable DC signal, means starting a second branch for providing a signal which inverts, amplifies by more than one and integrates the variable DC input of the first branch, means for providing a signal which clamps the amplified and integrated variable DC input of the first branch, means for providing a signal which amplifies by less than one the clamped, amplified and integrated variable DC input of the first branch and means for summing the outputs of the first and second branches. The overall amplifications in the two branches are equal so that there is a significant output signal of the summing means when the output of the second branch is clamped. The control signal is thus related to the output signal of the summing means and the significant output signal of the summing means corresponding to the decreasing level of the input signal approaching the noise level of the input signal acts to increase the amount of gain reduction of the dynamic range expander, thus reducing noise at the output of the dynamic range expander in the absence of an input signal.

In certain expander applications it is desirable to restrict the amount of positive expansion in the output signal while not affecting the negative expansion characteristic or imposing any limitation on the expansion ratio capability. This is particularly applicable where residual noise may be a critical factor and where positive expansion is not required, such as in controlling the decay time of artificial reverberation chambers.

Expansion limited in the positive direction only is useful in those applications where it is desired to have the output signal follow the input signal on a 1:1 amplitude basis for positive increases in amplitude. This has the effect of reducing noise present in the input signal due to the continually occuring downward expansion while increasing the overall dynamic range without undesirably affecting the characteristics of the program input signal, a feature which is particularly applicable to broadcast transmissions.

These and other objects, advantages and features of this invention will be apparent from the following description taken with reference to the accompanying drawings, wherein is shown the preferred embodiments of the invention.

BEST MODE FOR CARRYING OUT THE INVENTION

Figure 1:
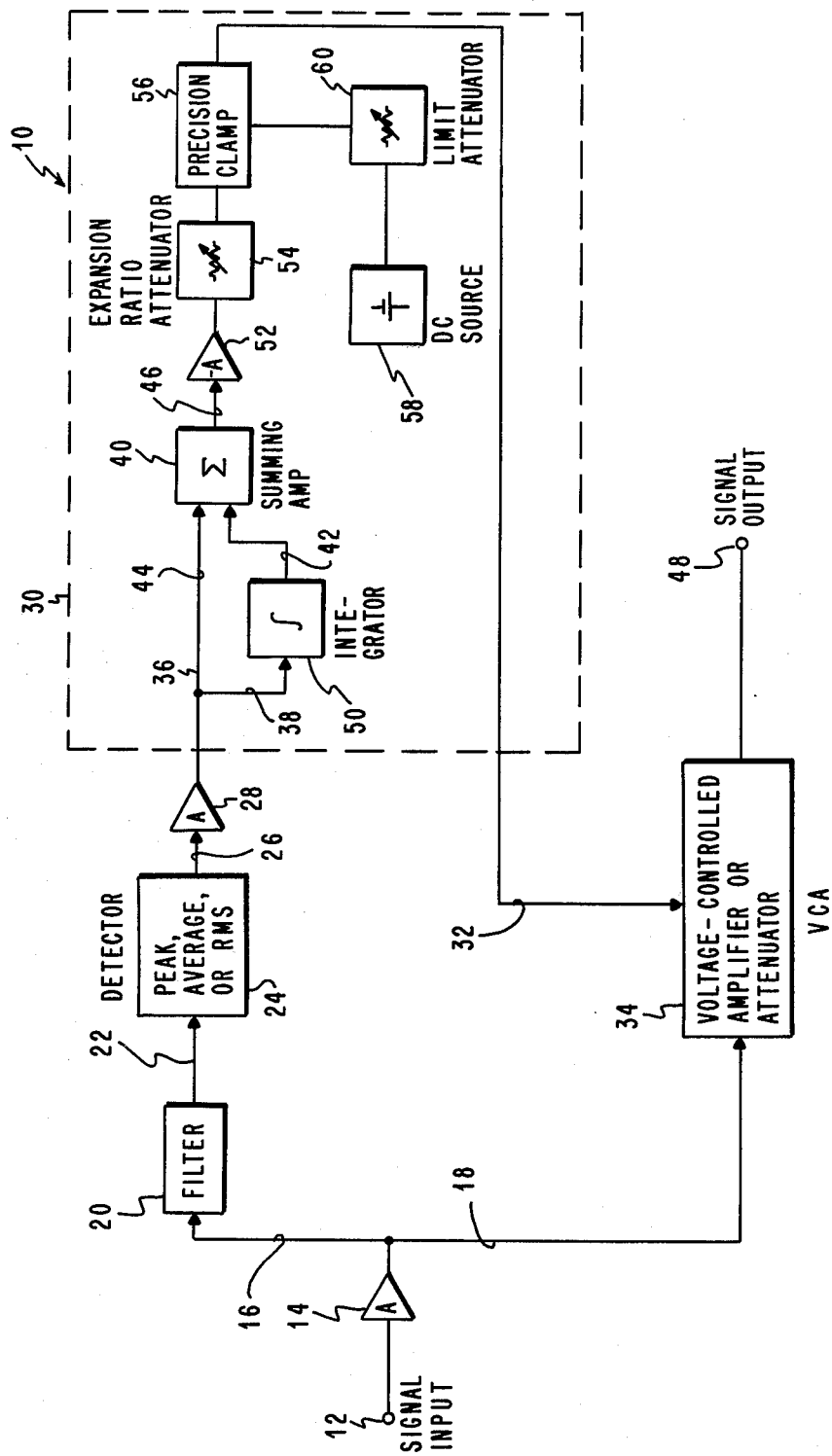
FIG. 1 is a block diagram representation of a dynamic range expander according to the present invention.

Referring now to the drawing, and in particular to FIG. 1, a dynamic range expander according to the present invention is referred to generally by reference numeral 10. An input signal originates at input 12 from any device whose output is an amplitude-varying monaural electrical signal. Input signal 12 is amplified to a desired reference level by input amplifier 14 before being divided into two discrete paths, control signal path 16 and signal path 18. A bandpass filter 20 provides a band-limited signal to the input 22 of means 24 for sensing the amplitude of the band-limited amplified input signal and for providing a variable DC signal at output 26 related to the amplitude of input signal 12. In the particular embodiment illustrated, means 24 is a detector of either a peak type, an averaging type or a root-mean-square (RMS) type which produces a linear or non-linear signal at output 26 which is related to the signal at its input 22. The signal at output 26 is then buffered by buffer amplifier 28. Dynamic range expander 10 also includes means 30 for providing a control signal at its output 32 related to the variable DC signal at output 26 of detector 24. Dynamic range expander 10 further includes means such as voltage controlled amplifier 34 for amplifying the input signal at the output of input amplifier 14 by a gain variable responsively to the control signal at output 32. Voltage controlled amplifier 34 could be an attenuator.

Means 30 for providing a control signal at output 32 includes a first branch 36 with a variable DC input which in this case is the output of buffer amplifier 28, a second branch 38 with the same variable DC input as first branch 36 and means 40 for summing the outputs of the first and second branches. Second branch 38 provides an output signal at output 42 that time averages and clamps the variable DC input by limiting the voltage excursion to a predetermined value when the input signal is below a predetermined amplitude level. The output signal at output 42 of second branch 38 is inverted with respect to the output signal at output 44 of first branch 36. The control signal at output 32 is related to the output signal 46 of summing means 40. There is a significant output signal at output 46 of summing means 40 when output 42 of second branch 38 is clamped. The significant output signal of the summing means 40 corresponding to decreasing levels in the input signal approaching the residual noise level of the input acts to increase the gain reduction of the signal at signal output 48. Means for inverting and time averaging such as an inverting integrator 50 is in second branch 38. Branch 36 along with branch 38 and summing means 40 act as one means for providing a second variable DC signal at output 46 related to the variable DC signal at output 26.

The output signal at output 46 is passed through inverting buffer amplifier 52 and expansion ratio attenuator 54. The attenuated output signal from expansion ratio attenuator 54 becomes the input to a precision clamp 56. The clamped signal at the output of precision clamp 56 is the control signal at output 32 of means 30 for providing a control signal. A DC voltage source 58 provides a predetermined voltage which, when attenuated by a limit attenuator 60 becomes the clamp voltage for precision clamp 56.

Figure 2:
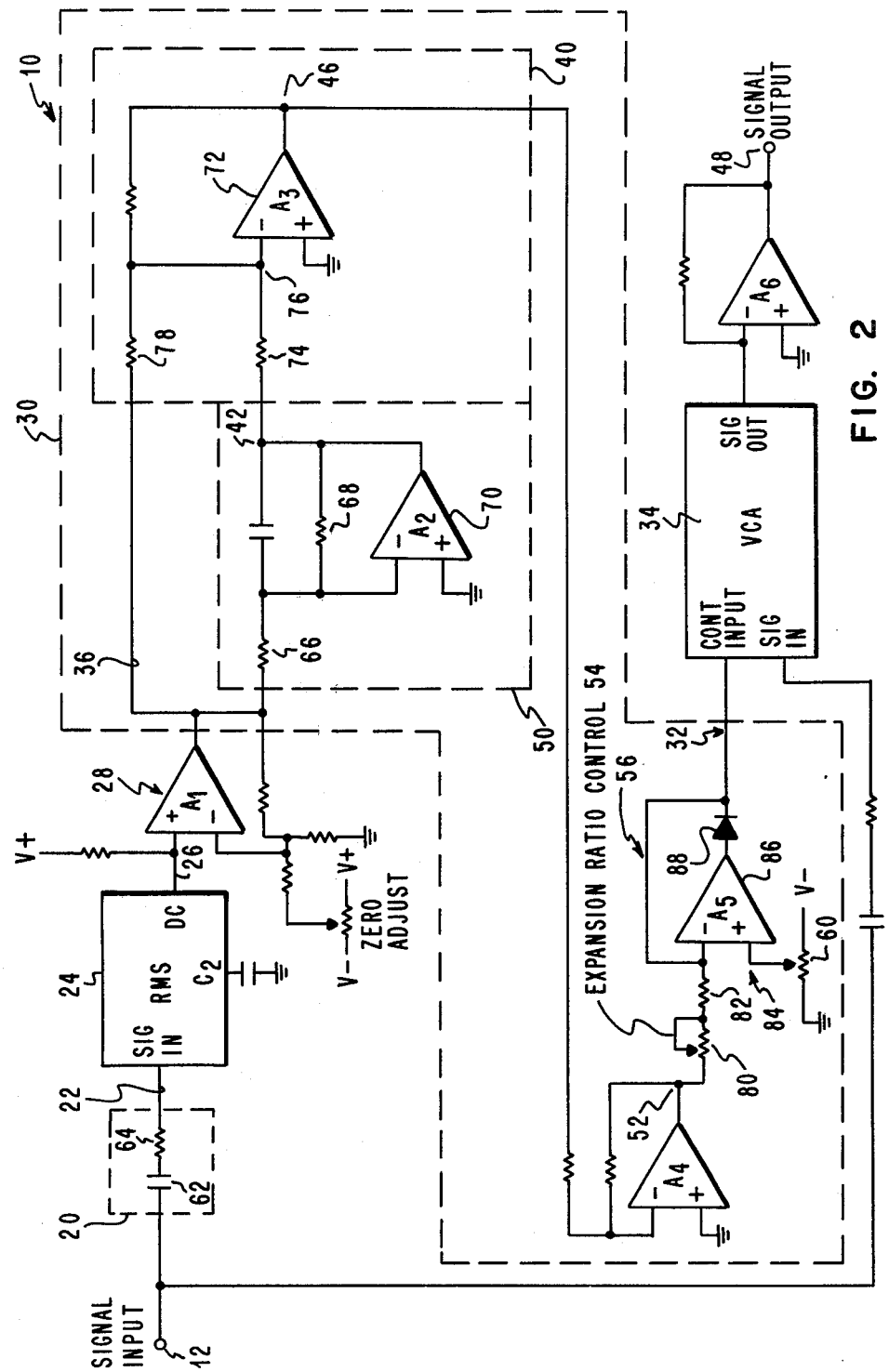
FIG. 2 is a circuit schematic partially in block diagram form of the dynamic range expander of FIG. 1.

Referring also to FIG. 2, input amplifier 14 is omitted since it is not needed in this case. Filter 20 includes a series combination of a capacitor 62 and resistor 64. Resistors 66 and 68 of inverting integrator 50 multiply the amplitude of the signal at the output of buffer amplifier 28 by the ratio of resistor 68 to resistor 66. In the embodiment illustrated, the signal is multiplied by ten since resistor 68 is ten times greater than resistor 66. Similarly, the ratio of the currents through resistors 74 and 78 are inversely proportional to the resistances so that resistor 78 will carry ten times the current per volt of resistor 74 when resistor 74 is ten times greater than resistor 78. This amplification makes the voltage swing of output 42 sufficiently great that operational amplifier 70 saturates at the voltage value of the negative power supply rail. If the power supply voltages are +15 volts and −15 volts DC, then clamping occurs near the −15 volts. Typical voltages in the circuit for constant amplitude input signal levels would be:

| Constant Amplitude Input Signal | D-C Voltages Present At: | | | |
| --- | --- | --- | --- | --- |
| Level (dBv) (OdBv = 0.775Vrms) | Output of 28 | Output 42 | Output 46 | Output of 52 |
| +20 | −1.5 | +15 | 0 | 0 |
| +10 | −1.0 | +10 | 0 | 0 |
| 0 | −0.5 | +5 | 0 | 0 |
| −10 (Reference level) | 0 | 0 | 0 | 0 |
| −20 | +0.5 | −5 | 0 | 0 |
| −30 | +0.1 | −10 | 0 | 0 |
| −40 | +1.5 | −15 | 0 | 0 |
| −50 | +2.0 | −15 | −1 | +1 |
| −60 | +2.5 | −15 | −2 | +2 |

It can now be seen that the overall gain in the second branch is the same as the overall gain in the first branch when looked at from the standpoint of the currents summed at operational amplifier 72 since resistor 74 connecting output 42 to summing input 76 of operational amplifier 72 is ten times greater than resistor 78 which connects first branch 36 to summing point 76.

The output of inverting buffer amplifier 52 is applied directly to expansion ratio control 54 where variable resistor 80 in conjunction with resistor 82 determine the range of expansion. The control signal at output 32 is a constant fraction of the signal at the output of inverting buffer amplifier 52 whenever the output of inverting buffer amplifier 52 exceeds the threshold voltage at non-inverting input 84 of operational amplifier 86. Diode 88 provides the clamping action such that, when the voltage at the output of inverting buffer amplifier 52 exceeds the voltage at non-inverting input 84, the control voltage present at output 32 equals the internal load resistance of the selected voltage controlled amplifier 34 times the voltage at the output of inverting buffer amplifier 52 divided by the sum of the effective resistance of resistors 80 and 82 and the internal load resistance. Because resistor 80 is variable, the control voltage may be varied over a range determined by its setting and the selection of resistor 82. The voltage set by limit attenuator 60 in turn controls the range of gain increase in voltage controlled amplifier 34, thus determining the range of expansion. For a chosen voltage controlled amplifier with unity gain for a control voltage of zero volts, the gain increases as the control voltage becomes more negative, or decreases as the control voltage becomes more positive. For those input signal variations where the voltage at the output of inverting buffer amplifier 52 is less than the voltage at non-inverting input 84, the control voltage at output 32 cannot be less than the voltage at non-inverting input 84 due to the clamping action previously described. It is thus possible to provide only gain reduction (negative expansion) for those input signals which cause the voltage at the output of inverting buffer amplifier 52 to exceed the voltage at non-inverting input 84. If the voltage at non-inverting input 84 is set at zero volts (ground potential) and the voltage at the output of inverting buffer amplifier 52 is less than zero volts (more negative), no increase in gain (positive expansion) will occur because the gain of the voltage controlled amplifier is held constant (unity gain) due to the zero volts present at output 32. The output of voltage controlled amplifier 34 is therefore a 1:1 relationship with the input signal to the circuit for positive amplitude increases and only negative expansion is permitted, which is significantly effective in reducing residual noise at the output terminal of the circuit.

As previously noted, the voltage at the output of inverting buffer amplifier 52 is maintained at a zero voltage reference level for input signals between approximately +20 and −40 dBv, and for input levels of approximately −50 dBv, the voltage at the output of inverting amplifier 52 increases to +1.0 volt. As the input voltage level approaches infinity in the negative direction, the voltage at the output of inverting buffer amplifier 52 reaches approximately +7 volts in the circuit illustrated. This voltage is large enough that, even when divided down by the voltage divider action of precision clamp 56, it remains large enough to keep the gain of voltage controlled amplifier 34 at or near its absolute minimum. If the residual noise at the input of the circuit were at a level of −60 dBv, for example, the noise voltage measured at the signal output of the circuit will be only the residual noise of the voltage controlled amplifier itself, including output buffer amplifier, and result in an overlay circuit noise that is improved by approximately 12 to 25 dB, depending upon the setting of expansion ratio control 54. In a circuit built in accordance with the present invention and with the input signal removed, unweighted noise measurements over a 100 kHz bandwidth provided values of approximately −90 dBv.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. A dynamic range expander for an input signal, comprising in combination:
    means for sensing the amplitude of the input signal and for providing a variable DC signal related to the amplitude of the input signal;
    means for providing a second variable DC signal related to the sum of the first variable DC signal and an inverted, time-averaged first DC signal;
    means for clamping the second variable DC signal;
    means for providing a control signal related to the clamped second variable DC signal; and
    means for amplifying the input signal by a gain variable responsively to the control signal wherein the control signal substantially limits the amount of positive expansion of the input signal without affecting the amount of negative expansion.

2. A dynamic range expander according to claim 1 wherein the means for providing a second variable DC signal provides increased gain reduction in the amplitude of the output signal when the amplitude of the input signal decreases toward or becomes less than the noise level present in the input signal.

3. A dynamic range expander according to claim 1 wherein the means for providing a second variable DC signal comprises:
    a first branch with a variable DC input related to the first variable DC signal;
    a second branch with the same variable DC input of the first branch and which provides an output signal that time averages and clamps the variable DC input at a predetermined value when the input signal approaches or is below the noise level wherein the output signal of the second branch is inverted with respect to the output signal of the first branch; and
    means for summing the outputs of the first and second branches whereby there is a significant output signal of the summing means when the output of the second branch is clamped, wherein the control signal is related to the output signal of the summing means and the significant output signal of the summing means corresponding to a decreasing amplitude of the input signal below a predetermined level, including absence of any input signal, correspondingly acts to increase the amount of gain reduction in the output signal of the dynamic range expander.

4. A dynamic range expander according to claim 1 wherein the means for providing a second variable DC signal comprises:
    a first branch with variable DC input related to the first variable DC signal;

means starting a second branch for providing a signal which inverts, amplifies by equal to or more than one and time averages the variable DC input of the first branch and which clamps the amplified and time averaged variable DC input of the first branch at a predetermined DC value; and means for amplifying and summing the output of the first branch with the signal provided by the means for starting a second branch wherein the overall amplifications of the signal traveling in the two branches are substantially equal whereby there is a significant output signal of the summing means when the output of the second branch is clamped and the input signal is below a predetermined value, wherein the control signal is related to the output signal of the summing means and the significant output signal of the summing means corresponding to a decreasing amplitude of the input signal below a predetermined level, including absence of any input signal, correspondingly acts to increase the amount of gain reduction in the output signal of the dynamic range expander.

5. A dynamic range expander for an input signal, comprising in combination:

means for sensing the amplitude of the input signal and for providing a variable DC signal related to the amplitude of the input signal;

a first branch with a variable DC input related to the variable DC signal;

a second branch with the same variable DC input of the first branch and which provides an output signal that time averages and clamps the variable DC input at a predetermined value when the input signal approaches or is below the noise level wherein the output signal of the second branch is inverted with respect to the output signal of the first branch;

means for summing the outputs of the first and second branches whereby there is a significant output signal of the summing means when the output of the second branch is clamped;

means for providing a control signal related to the output signal of the summing means and the significant output signal of the summing means corresponding to a decreasing amplitude of the input signal below a predetermined level, including absence of any input signal, correspondingly acts to increase the amount of gain reduction in the output signal of the dynamic range expander; and means for amplifying the input signal by a gain variable responsively to the control signal wherein the means for providing a control signal provides increased negative expansion when the input signal is below a predetermined level, including the absence of any input signal, but not excluding the expected noise level.

6. A dynamic range expander for an input signal, comprising in combination: means for sensing the amplitude of the input signal and for providing a variable DC signal related to the amplitude of the input signal;

a first branch with a variable DC input related to the variable DC signal;

means starting a second branch for providing a signal which inverts, amplifies by equal to or more than one and time averages the variable DC input of the first branch and which clamps the amplified and time averaged variable DC input of the first branch at a predetermined DC value;

means for amplifying and summing the output of the first branch with the signal provided by the means for starting a second branch wherein the overall amplifications of the signal traveling in the two branches are substantially equal whereby there is a significant output signal of the summing means when the output of the second branch is clamped and the input signal is below a predetermined value;

means for providing a control signal is related to the output signal of the summing means and the significant output signal of the summing means corresponding to a decreasing amplitude of the input signal below a predetermined level, including absence of any input signal, correspondingly acts to increase the amount of gain reduction in the output signal of the dynamic range expander; and means for amplifying the input signal by a gain variable responsively to the control signal wherein the means for providing a control signal provides increased negative expansion when the input signal is below a predetermined level, including the absence of any input signal, but not excluding the expected noise level.

* * * * *